(12) United States Patent
Lansford

(10) Patent No.: US 6,335,286 B1
(45) Date of Patent: Jan. 1, 2002

(54) FEEDBACK CONTROL OF POLISH BUFF TIME AS A FUNCTION OF SCRATCH COUNT

(75) Inventor: Jeremy Lansford, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/568,867

(22) Filed: May 9, 2000

(51) Int. Cl.7 .............................................. H01L 21/00
(52) U.S. Cl. ..................... 438/692; 156/345; 216/38; 216/84; 216/88; 438/8; 438/745
(58) Field of Search ............................. 216/38, 84, 88, 216/89; 438/8, 14, 691, 692, 693, 745; 156/345 LP, 345 LC

(56) References Cited

U.S. PATENT DOCUMENTS 5,560,802 A * 10/1996 Chisholm .................... 438/692
5,705,435 A * 1/1998 Chen ............................. 438/8
6,066,230 A * 5/2000 Arai ........................... 438/8 X

* cited by examiner

Primary Examiner—William A. Powell
(74) Attorney, Agent, or Firm—Williams, Morgan & Amerson, P.C.

(57) ABSTRACT

A method includes providing a first wafer having at least one process layer formed thereon. A portion of a first process layer is removed using a polishing process. A portion of at least one of the first process layer and a second process layer is removed using a buffing process for a pre-selected duration of time. A buffed surface of at least one of the first process layer and the second process layer is inspected to determine a post-buff defect density for the inspected process layer. The duration of the buffing process is adjusted for a second wafer based on the determined post-buff defect density of the inspected process layer. A system includes a processing tool, at least one metrology tool, and a process controller. The processing tool is adapted to remove at least a portion of a first process layer of a first wafer using a buffing process for a pre-selected duration of time. The at least one metrology tool is adapted to determine a post-buff defect density of at least one of the first process layer and a second process layer. The process controller is coupled to at least one of the processing tool and the at least one metrology tool. The process controller is adapted to receive the determined post-buff defect density from the at least one metrology tool, and adjust the duration of the buffing process for a second wafer based on the determined post-buff defect density of the first wafer.

38 Claims, 8 Drawing Sheets

FEEDBACK CONTROL OF POLISH BUFF TIME AS A FUNCTION OF SCRATCH COUNT

BACKGROUND OF THE INVENTION

1. Field of the Invention

This invention relates generally to semiconductor processing, and more particularly, to chemical mechanical polishing (CMP) using feedback control of polish buff time as a function of post-buff scratch count.

2. Description of the Related Art

CMP is a widely used means of planarizing silicon dioxide as well as other types of processing layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted or above a semi-rigid linearly-moving belt on which a polishing pad is mounted. The polishing device may include one or more rotating carrier heads to which wafers may be secured, typically through the use of vacuum pressure. In use, the platen may be rotated and an abrasive slurry may be dispersed onto the polishing pad. Once the slurry has been applied to the polishing pad, a downward force may be applied to each rotating carrier head to press the attached wafer against the polishing pad. As the wafer is pressed against the polishing pad, a surface of a process layer formed above the wafer is mechanically and chemically polished.

As the size of semiconductor devices is scaled down, the importance of chemical mechanical polishing to the fabrication process increases. In particular, it becomes increasingly important to minimize surface damage, such as microscratching, to either a postpolish surface of a process layer, or if the process layer is completely removed during the polishing process, to any underlying material residing beneath the polished process layer, such as another process layer. For example, in one embodiment, during a CMP process, abrasive particles within the slurry may be used to mechanically abrade a polishing surface of a process layer that has been formed above the wafer. As the wafer is polished, the interaction between the polishing surface and the abrasive particles may produce undesirable surface damage (e.g., microscratches) to the post-polish surface of the process layer.

In one illustrative embodiment, an oxide layer of a wafer may be planarized using a conventional CMP process (i.e., the surface of the oxide layer may be polished to produce a more uniform layer of material.) During this process, the interaction between the abrasive particles within the slurry and the surface of the oxide layer may produce undesirable surface damage, such as microscratches, in the polished surface of the oxide layer. Moreover, the severity of the surface damage may depend upon, among other things, the processing parameters of the polishing process (e.g., polishing time, slurry composition, carrier arm down force, etc.) Additionally, changes in polishing process consumables, such as slurry particle distribution, polishing pad wear, and the like, may also contribute to damaging a surface of a process layer. If not removed, microscratches or other types of surface damage may "trap" portions of additional process layers within the oxide layer during subsequent processing steps.

For example, once the polishing of the oxide layer is complete, depending upon the particular process, additional process layers may be formed on the polished surface of the oxide layer. With one exemplary process, a conductive layer of material, such as metal, may be deposited on the polished surface of the oxide layer. As with conventional processing, the metal processing layer may be patterned, etched, and/or polished to produce at least a portion of a desired integrated circuit feature or configuration. For example, a blanket metal layer comprised of tungsten or copper may be formed above openings in the oxide layer and then subsequently polished to form electrical paths (e.g., interconnects) between stacked processing layers. Unfortunately, if microscratches are present in the polished surface of the oxide layer, portions of the metal processing layer may become "trapped" within the oxide layer, which may result in poor performance of the finished semiconductor device. For example, the "trapped" portion of the metal layer may produce a short circuit condition within the finished device or, in a less extreme case, undesirably high electrical leakage currents between adjacent metal lines.

One conventional method for alleviating polishing induced damage to the surface of a wafer or a process layer is post-polish buffing. For example, once the CMP process is complete, the post-polish surface of the process layer may be processed through a "buff" step, which may at least partially reduce the severity of any surface damage. Additionally, if the polished process layer is substantially removed during the polishing process, the underlying material (e.g., wafer, additional process layer, etc.) may be at least partially exposed to the polishing process. If this occurs, the underlying material may be processed through the "buff" step to remove any surface damage that may have occurred during exposure to the polishing process. In one embodiment, the "buff" step comprises positioning the polished surface of a process layer or the exposed underlying material against a rotating buffing pad that has been mounted to a platen. During this process, surface damage, such as microscratches, may be at least partially eliminated by slowly removing a portion of the process layer resulting in a substantially defect free post-buff surface.

The duration of the buff process may be limited by the thickness of the material being processed. For example, in one embodiment, a layer of silicon dioxide may be used as an electrically insulating layer between stacked metal process layers that have been formed above a surface of a wafer. To provide sufficient electrical isolation, a minimum thickness of the oxide layer may be required to prevent cross-talk or other signal disturbances between the stacked metal process layers. Because the post-polish buff process may remove a portion of the material being processed, a compromise is typically made between removing surface defects and maintaining a minimum thickness of the process layer.

Additionally, the duration of the buff process may be limited by increases in the surface non-uniformity of the process layer. In some application, increasing the duration of the buff process may undesirably increase the variability in thickness of the material being processed, thus, resulting in increased surface non-uniformity of a process layer. To prevent unreasonable increases in surface non-uniformity, a compromise is typically made between removing surface defects and preventing increases in surface non-uniformity.

Typically, the duration of the buff step is a process parameter that is part of an overall predetermined polish recipe. Currently, process engineers and other technicians have limited ability to adjust the duration of a post-polish buff process. Moreover, determining the duration of the post-polish buff process is exacerbated by the interrelation of the processing parameters involved, such as process layer thickness, defect density, surface non-uniformity, and the like.

The present invention is directed to overcoming, or at least reducing the effects of, one or more of the problems set forth above.

SUMMARY OF THE INVENTION

In one aspect of the present invention, a method is provided. The method includes providing a first wafer having at least one process layer formed thereon. A portion of a first process layer is removed using a polishing process. A portion of at least one of the first process layer and a second process layer is removed using a buffing process for a pre-selected duration of time. A buffed surface of at least one of the first process layer and the second process layer is inspected to determine a post-buff defect density for the inspected process layer. The duration of the buffing process is adjusted for a second wafer based on the determined post-buff defect density of the inspected process layer.

In another aspect of the present invention, a system is provided. The system includes a processing tool, at least one metrology tool, and a process controller. The processing tool is adapted to remove at least a portion of a first process layer of a first wafer using a buffing process for a pre-selected duration of time. The at least one metrology tool is adapted to determine a post-buff defect density of at least one of the first process layer and a second process layer. The process controller is coupled to at least one of the processing tool and the at least one metrology tool. The process controller is adapted to receive the determined postbuff defect density from the at least one metrology tool, and adjust the duration of the buffing process for a second wafer based on the determined post-buff defect density of the first wafer.

BRIEF DESCRIPTION OF THE DRAWINGS

The invention may be understood by reference to the following description taken in conjunction with the accompanying drawings, in which like reference numerals identify like elements, and in which.

Figure 1:
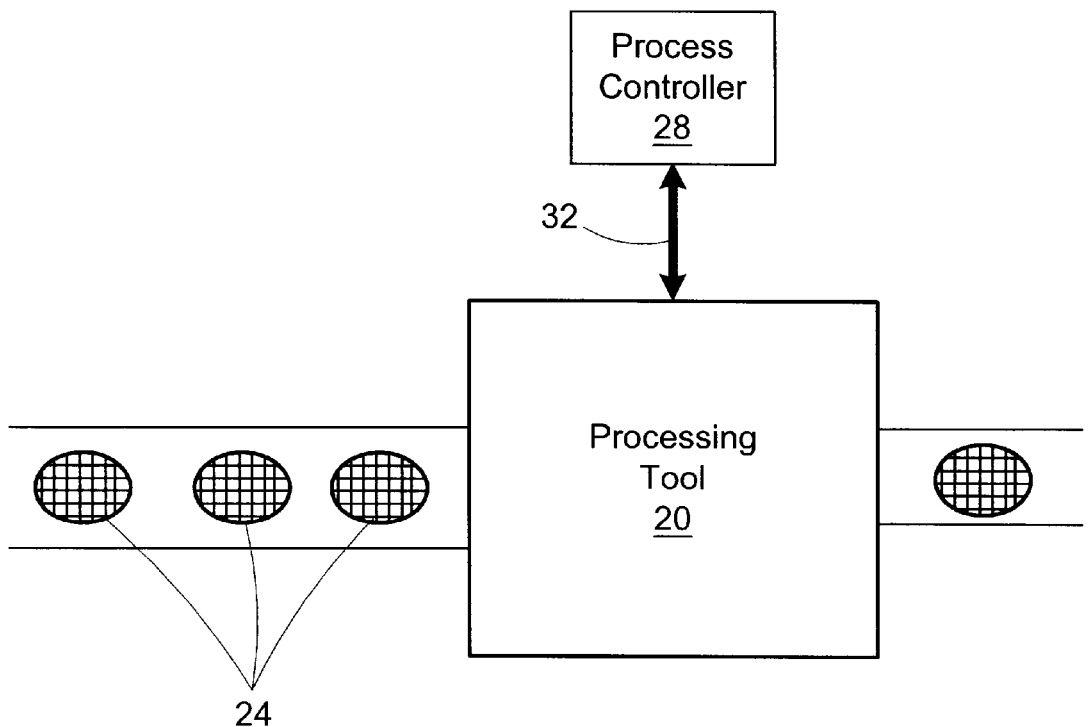
FIG. 1 is a simplified block diagram of a processing tool used to manufacture semiconductor devices.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a CMP process that uses feedback control of polish buff time as a function of post-buff scratch count. In disclosing the present invention, reference will be made to the illustrative embodiment of the invention depicted in FIGS. 1–7. The relative sizes of the various features depicted in the drawings may be exaggerated or reduced as compared to the size of those feature sizes on actual devices. Nevertheless, the attached drawings are included to aid in obtaining an understanding of the present invention.

Referring to FIG. 1, an exemplary processing tool 20 is shown. The processing tool 20 may be used as one part of a fabrication process to manufacture semiconductor wafers 24 into functional semiconductor devices. The processing tool 20 may be controlled by a process controller 28 that may send a plurality of control signals to the processing tool on a control line 32. The process controller 28 may be comprised of a variety of devices. For example, in one embodiment, the process controller 28 may be a controller embedded inside the processing tool 20 and communicate with the processing tool 20 using protocols and interfaces provided by the manufacturer. Alternatively, the process controller 28 may be connected to a larger network of controllers and communicate with the processing tool 20 through an Advanced Process Control (APC) framework interface. For example, the processing tool 20 may be coupled to an equipment interface (not shown) that retrieves various operational data from the processing tool 20 and communicates this data to the Advanced Process Control (APC) framework. Moreover, the equipment interface may receive control signals from the APC framework that may be used to control the processing tool 20.

The semiconductor wafers 24 are generally processed in batches, which are commonly referred to as lots or batch processing. For example, a lot of wafers 24 may be comprised of twenty-five wafers. The wafers 24 within a lot progress through the manufacturing process together in an attempt to subject the wafers 24 to substantially the same manufacturing conditions, such that the resulting semiconductor devices have substantially the same performance characteristics (e.g., speed, power, etc.).

Figure 2:
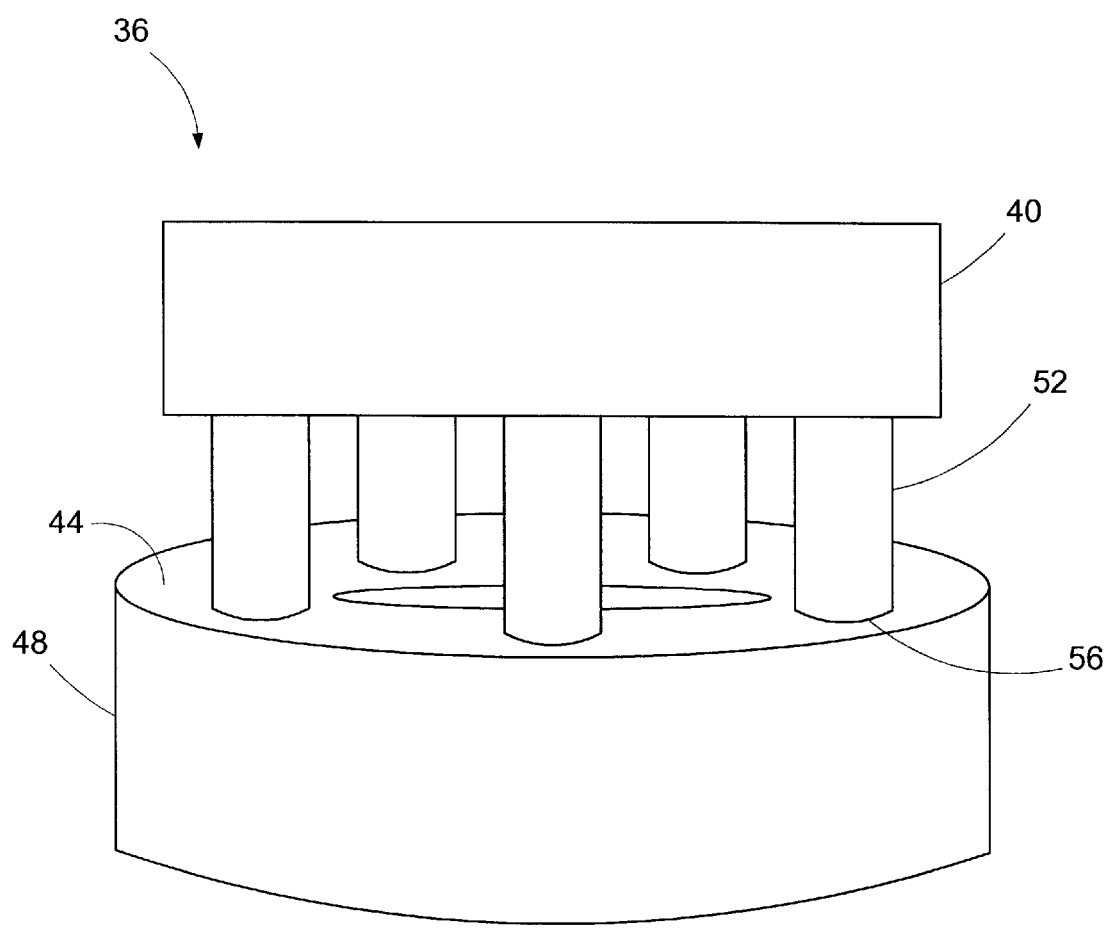
FIG. 2 illustrates a conventional polishing tool having multiple arms.

Referring to FIG. 2, an exemplary multiple arm polishing tool 36 is shown. The exemplary polishing tool 36 may be comprised of a multi-head carrier 40 positioned above a polishing pad 44 that is mounted on a rotateable platen 48. The multi-head carrier 40 typically includes a plurality of rotateable polishing arms 52, each of which includes a carrier head 56. Wafers (not shown) may be secured to the carrier heads 56 using known techniques, such as vacuum pressure. A source of polishing fluid (not shown) may be provided to supply polishing fluid (e.g., slurry) to the polishing pad 44. Furthermore, although five polishing arms 52 are shown, the polishing tool 36 may be comprised of any number of polishing arms 52. For example, in one embodiment, the polishing tool 36 is comprised of only a single polishing arm 52, and each wafer is polished individually.

Figure 3:
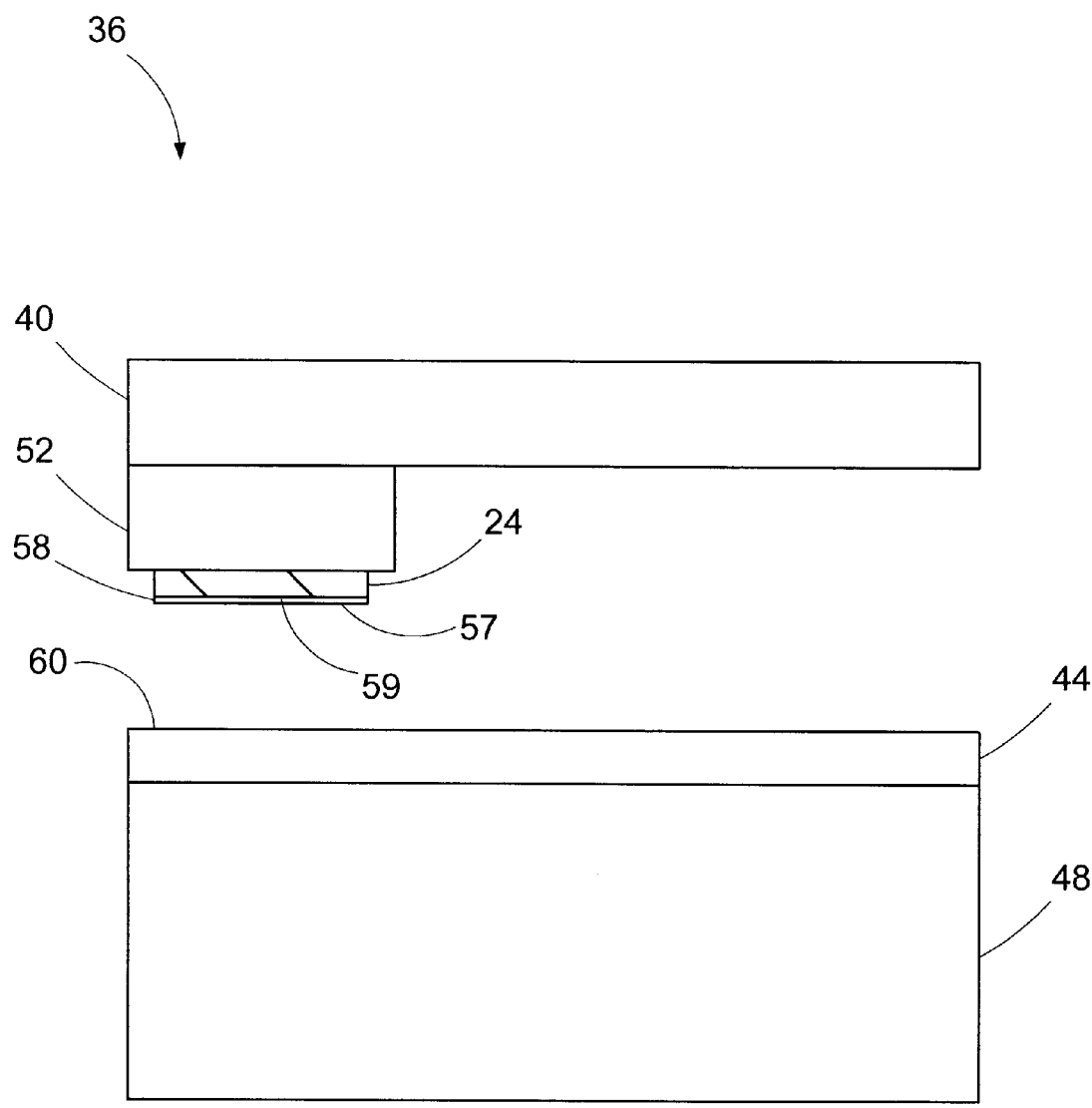
FIG. 3 is a simplified side-view of the polishing tool illustrated in FIG. 2.

Referring to FIG. 3, a simplified side-view of a portion of the illustrative polishing tool 36 is shown. To simplify illustration of the operation of the polishing tool 36, only one polishing arm 52 is shown. Again, the polishing pad 44 may be fixed to the rotatable platen 48. A wafer 24 is coupled to the rotatable polishing arm 52, using, for example, vacuum pressure, and the polishing arm 52 may be coupled to the carrier 40. To effectuate polishing, the polishing arm 52 may be extended such that a polishing surface 57 of a process layer 58 formed above a surface 59 of the wafer 24 is pressed against a polishing surface 60 of the polishing pad 44. Furthermore, the platen 48 may be rotated, typically at a constant speed. Moreover, a variable downward force may be applied to the polishing arm 52, and the polishing arm 52 may be rotated and oscillated back and forth across the polishing pad 44.

For ease of illustration, the present invention is described with reference to polishing the process layer 58. However, the present invention should not be construed as being limited to polishing a single process layer 58 formed above a surface 59 of the wafer 24. For example, in a second embodiment, if no process layers 58 are present, the surface 59 of the wafer 24 may be polished in a similar manner as described above. Moreover, in another embodiment, depending upon the process, many process layers 58 may be formed above the surface 59 of the wafer 24, and any exposed portions of the process layers may be polished. For example, if the process layer 58 of the wafer 24 is substantially removed during a polishing process, any underlying material (e.g., the wafer 24, an additional process layer, etc.) may be at least partially exposed to the polishing process.

Figure 4:
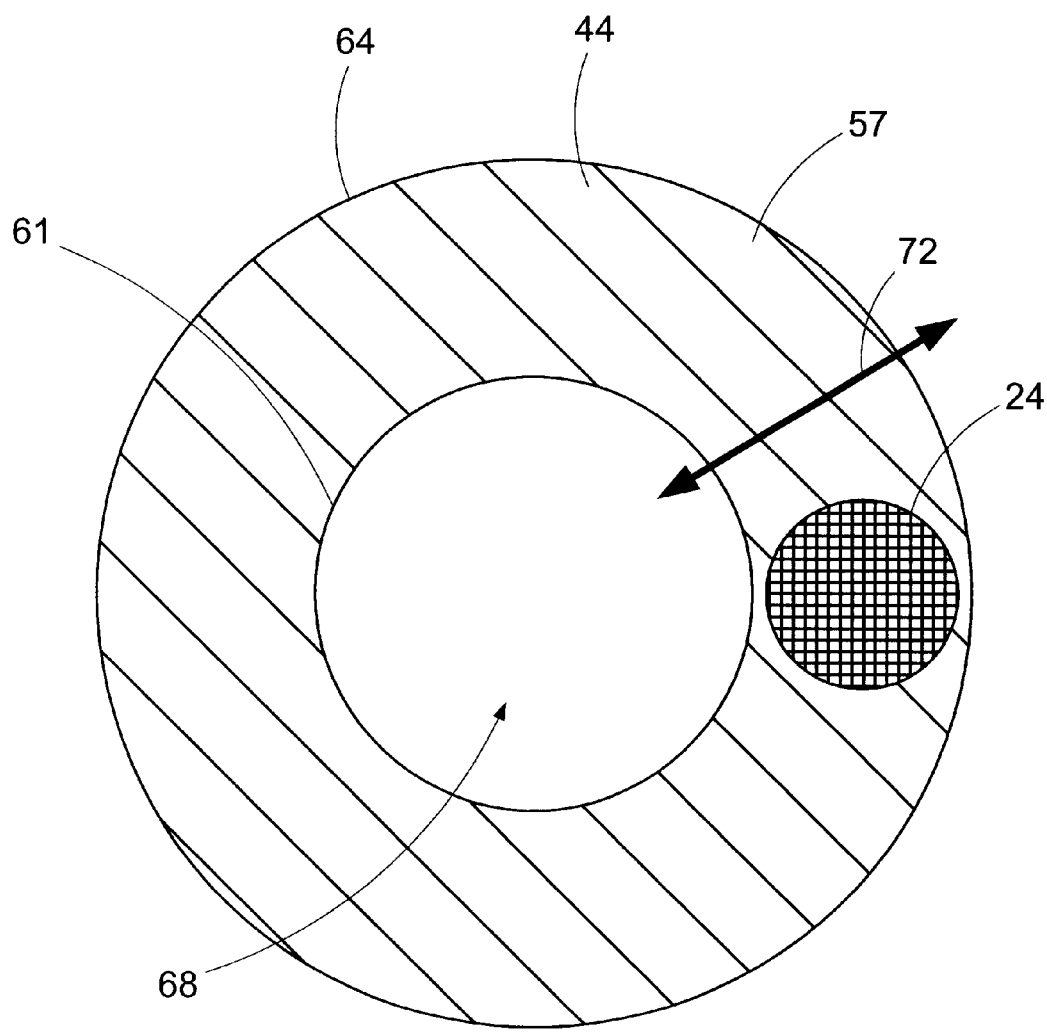
FIG. 4 is a simplified top-view of the polishing tool, shown in FIG. 2.

Referring to FIG. 4, a top-view of the polishing pad 44, illustrated in FIGS. 2 and 3, is shown. The polishing pad 44 may include an inner edge 61, an outer edge 64, and have an opening 68 positioned therein. Moreover, the wafer 24 is shown positioned against the polishing pad 44 between the inner and outer edge 61, 64. For simplicity of illustration, the polishing arms 52 and other elements of the polishing tool 36 are not shown. In addition, those skilled in the art will appreciate that a plurality of wafers 24 may be polished at the same time, and that FIG. 4 is a simplified view of the polishing pad 44.

During the polishing process, the wafer 24 may oscillate back and forth across the polishing pad 44. The direction of the oscillation is indicated by an arrow 72. Normally, the oscillation length may be adjusted such that a portion of the wafer 24 moves slightly off the inner edge 61 of the polishing pad 44 at the minimum point of oscillation and slightly off the outer edge 64 of the polishing pad 44 at the maximum point of oscillation. Moreover, the oscillation length may be adjusted, and by increasing or decreasing the portion of the wafer 24 that moves off of the polishing pad 44 at the minimum and maximum points of oscillation, the center-to-edge polish rate may be adjusted.

Typically, during a polishing process, the slurry is dispersed onto the polishing surface 57 of the polishing pad 44. Once the slurry is deposited onto the polishing pad 44, the chemical and mechanical properties of the slurry may be used to abrade a polishing surface 57 of a process layer 58 formed above the wafer 24 (illustrated in FIG. 3.) For example, depending upon the polishing process, the interaction between the process layer 58, the polishing pad 44, and the abrasive particles within the slurry may be used to mechanically abrade at least a portion of the polishing surface 57 of the process layer 58 formed on the wafer 24.

As the wafers 24 are polished, the slurry may be gradually recaptured, filtered and, re-circulated back into the polishing process as part of a slurry re-circulation loop (not shown). The slurry re-circulation loop may be used to maintain a desired abrasive particle size within the slurry. For example, by filtering the slurry, large groupings of abrasive particles that have become "clumped" together may be removed from the slurry. In addition, by using several slurry re-circulation loops, multiple slurries having different chemical compositions and abrasive properties may be selectable for a particular polishing tool 36.

During a polishing process, the polishing surface 57 of the process layer 58 (shown in FIG. 3) may become damaged from, among other things, the physical interaction with the polishing pad 44 and the abrasive particles within the slurry. For example, the abrasive particles within the slurry, while abrading a portion of the process layer 58, may produce undesirable surface scratches (e.g., microscratches) in a post-polish surface (not shown) of the process layer 58. Moreover, the severity of the surface damage (e.g., defect density) may depend upon, among other things, the processing parameters of the polishing process (e.g., polishing time, slurry composition, carrier arm down force, etc.).

To alleviate and/or eliminate surface damage from the post-polish surface of the process layer 58, once the polishing process is complete, the process layer 58 and/or any other exposed portions of the wafer 24 may be subjected to a buff process. In one embodiment, the process layer 58 may be substantially removed during the polishing process exposing a portion of the underlying material (e.g., wafer surface 59, additional process layer, etc.) to the polishing process. If this occurs, the underlying material, in addition to any residual portion of the process layer 58, may be processed through the "buff" step to at least partially remove any post-polish surface damage that may have occurred during exposure to the polishing process. In another embodiment, the process layer 58 may only be partially removed during the polishing process, and as a result, the post-polish surface of the process layer 58 is exposed to the post-polish buff process.

To a large extent, a buff process is similar to the polishing process described above, although specific implementations may vary, depending upon the particular polishing process, polishing tool 36, process layer characteristics, and other processing variables. Because a buff process may be adaptable to various applications, the present invention should not be construed as being limited to specific processing characteristics of a particular buff process implementation. However, in the interest of clarity, several exemplary buff process are described below.

In one embodiment, to effectuate a buff process, a buffing wheel (not shown) may be attached to a secondary platen (not shown.) The secondary platen may be rotated and a postpolish surface of the process layer 58, formed above the wafer 24, may be pressed against the rotating buffing wheel. The interaction with the rotating buffing wheel may be used to alleviate and/or remove surface defects from the post-polish surface of the process layer 58 (i.e., the buff process may be used to at least partially reduce the post-polish defect density of the process layer 58.) Additionally, if no process layers are present, the surface 59 of the wafer 24 may be subjected to the illustrative buff process, thus, optimizing the surface 59 for additional processing. Those skilled in the art will appreciate that, as described for the polishing process, similar wafer handling elements (e.g., multi-head carrier 40, polishing arms 48, carrier heads 56, etc.) may be used to handle a wafer 24 during the buff process. For example, in one embodiment, the secondary platen may be part of the polishing tool 36 or reside in close proximity thereto, which is the case for an Auriga-C™ polishing tool that is manufactured by SpeedFam-IPEC and for a Mirra™ polishing tool that is manufactured by Applied Materials.

In another embodiment, the buff process may be implemented on the same platen 48 as the polishing process. With this embodiment, once the polishing process is complete, a slurry that is optimized for the buff process may be dispersed onto the polishing pad 44. For example, if the process layer 58 is substantially removed during the polishing process and the exposed underlying material is comprised of silicon dioxide, a slurry may be selected, for the buff process, that is optimized for slowly abrading silicon dioxide. With this example, the buff process may be used to remove a portion of the silicon dioxide, thus, alleviating or removing any surface damage that may be present. Moreover, the duration of the buff process may significantly affect other processing characteristics of the wafer. For example, the duration of the buff process may impact post-buff defect density, the thickness of the process layer 58 or any underlying material, surface non-uniformity, and the like. As will be described below, the duration of the buff process may be optimized for a current wafer 24 based on, among other things, the post-buff surface characteristics of a previously processed wafers 24.

Figure 5:
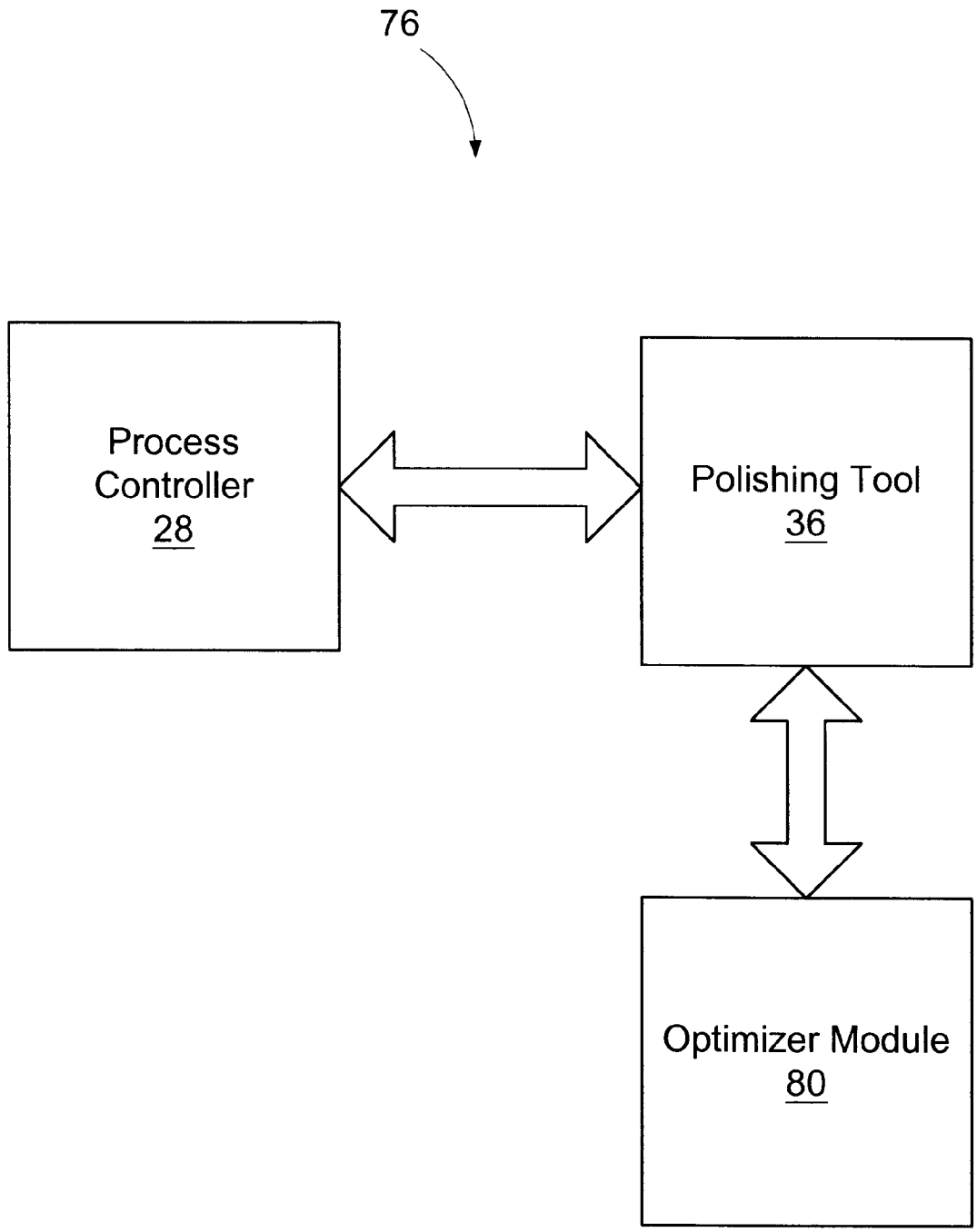
FIG. 5 is an exemplary control system for the polishing tool, shown in FIG. 2.

Referring to FIG. 5, an exemplary control system 76 for the polishing tool 36 is shown. Generally, a variety of control systems may be used with the present invention. Furthermore, because any number of control systems may be implemented, the exemplary control system 76 described herein should not be considered as a limitation of the present invention.

In this illustrative embodiment, the control system 76 may be comprised of the process controller 28, the polishing tool 36, and an optimizer module 80. The process controller 28 may be coupled to the polishing tool 36, which may be capable of communicating with the optimizer module 80. Alternatively, in other embodiments, the process controller 28 may communicate directly with the optimizer module 80 or any other device that may be controlling the duration of a post-polish buff process. Although not shown, various metrology tools may be capable of providing wafer processing data to the process controller 28 and/or the optimizer module 80. For example, as will be described below, the metrology tools may be used to gather post-buff processing data from processed wafers, and this data may be used by the control system 76 to adjust the duration of a post-polish buff process.

In one embodiment, the optimizer module may be capable of receiving post-buff processing data, such as defect density, process layer thickness, surface non-uniformity, and the like, and based on this data determine an optimal duration of a buff process. For example, the optimizer module 80 may determine that, because of residual post-buff surface defects in the process layer 58 or wafer 24, an increase in buff duration may be appropriate. Alternatively, in another illustrative example, the optimizer module 80 may determine that the post-buff thickness of the process layer 58 or any underlying material is too thin and that a decrease in buff duration is appropriate.

Once the optimizer module 80 determines the optimal duration for the buff process, this data may be provided to the process controller 28, and the process controller 28, based on the determined optimal duration for the buff process, may adjust the duration of the buff process for subsequently processed wafers 24. Additionally, the optimizer module 80 may be used to detect faults (e.g., significantly misprocessed wafers) in the polishing process or other areas of the manufacturing process. For example, if the optimizer module 80 determines that extraordinarily large adjustments are necessary for the duration of the buff process, the process controller 28, based on the large adjustments values, may be capable of recognizing there is a problem in the process. Moreover, once a problem is detected, the process controller 28 may terminate the manufacturing process, and/or alert a technician using any available notification means (e.g., audible signal, visual signal, email, etc.)

Although the optimizer module 80 is illustrated as a separate device, the functionality of the optimizer module 80 may be implemented within one of the other components of the control system 76. For example, the functionality of the optimizer module 80 may be included within the polishing tool 36 and/or the process controller 28. With this illustrative embodiment, the process controller 28 may receive post-buff data and determine the appropriate adjustments to the duration of the buff process for subsequently processed wafers 24. Alternatively, as described above, the control system 76 may be provided by the manufacturer of the polishing tool 36, and in a similar manner as described above, appropriate adjustments to the buff time may be determined by the polishing tool 36.

In one embodiment, the control system 76 may be implemented using a programmable computer (not shown.) For example, the programmable computer may include a personal computer, a workstation, a network server, a mainframe computer, or the like. The computer may communicate with the polishing tool 36 using a variety of know bus systems, and operate under any suitable operating systems, such as Windows®, MS-DOS, OS/2, UNIX, or the like. Furthermore, the computer may be programmed to execute an application software package whose instructions may be encoded on a computer-readable program storage device, such as a floppy disk. Moreover, the instructions may be included on the hard disk of the computer or other storage medium. More particularly, the computer may be programmed to implement the process of FIG. 6.

Figure 6:
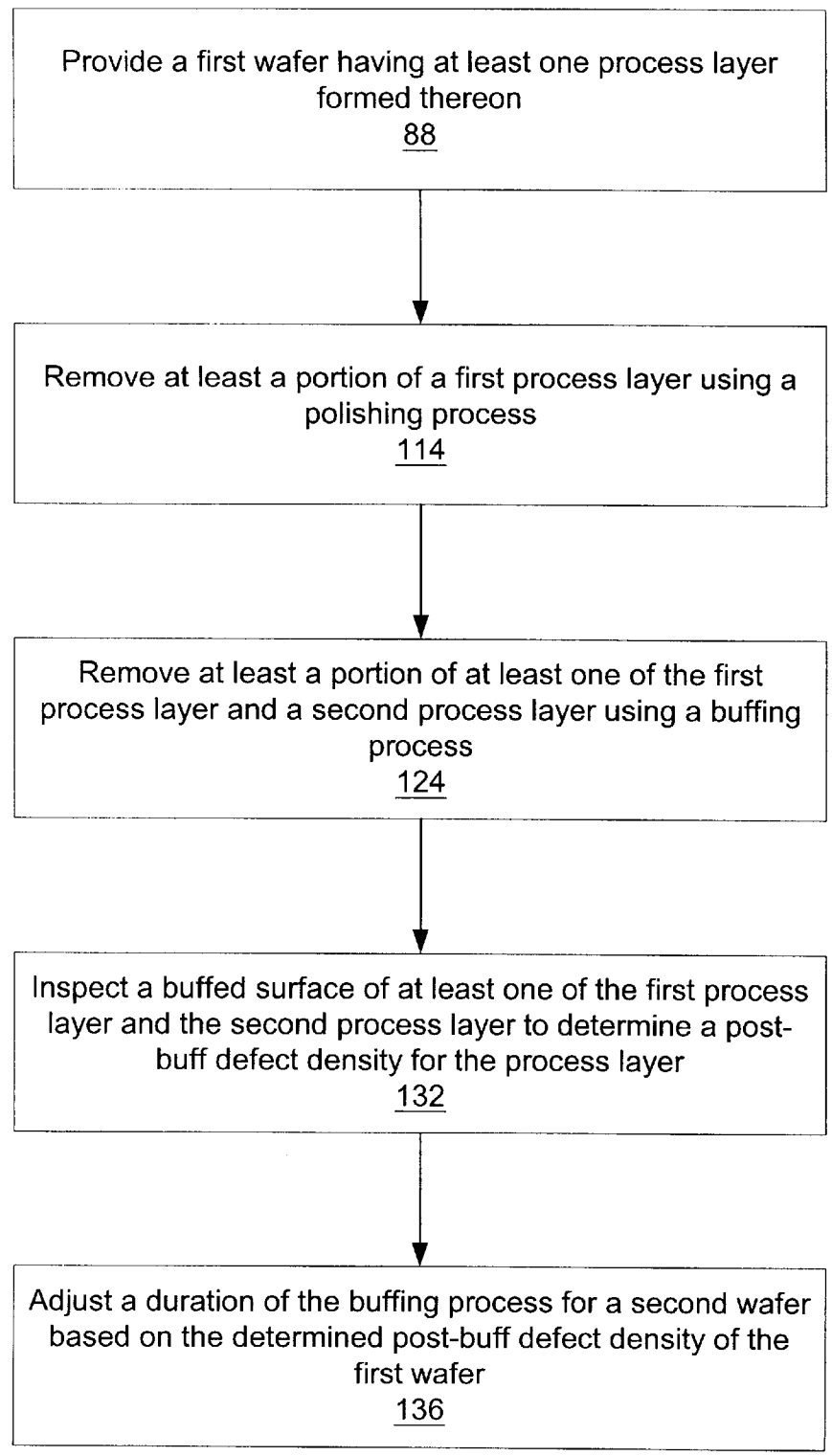
FIG. 6 is a simplified block diagram illustrating one exemplary process for the polishing tool illustrated in FIG. 2 in accordance with one aspect of the present invention.
Figure 7A:
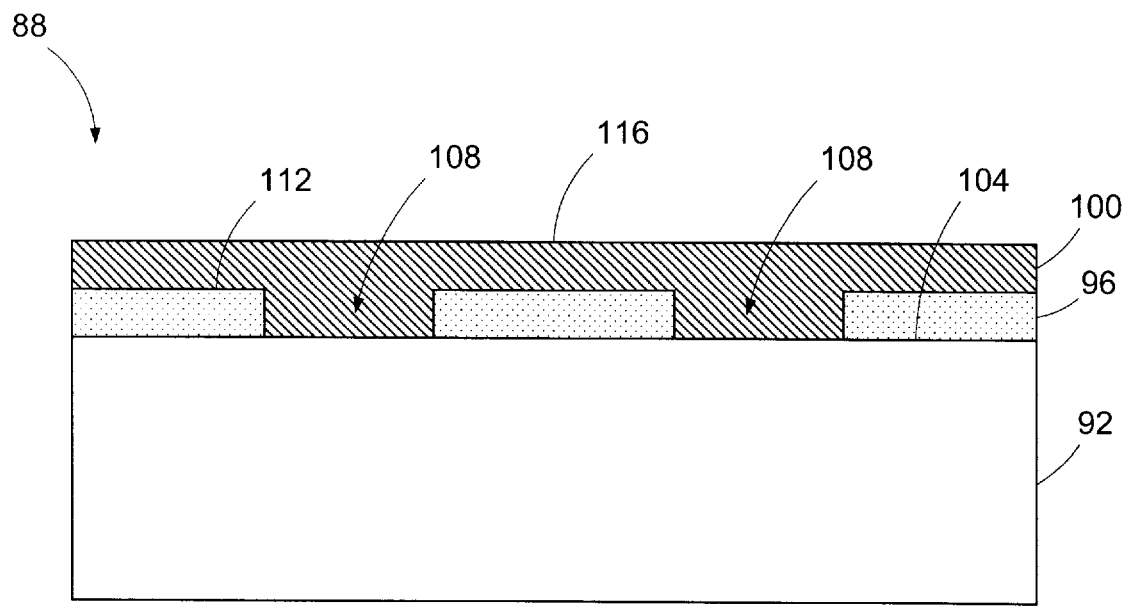
FIGS. 7A–7C are simplified cross-sectional views of a wafer used to illustrate the exemplary process shown in FIG. 6.
Figure 7B:
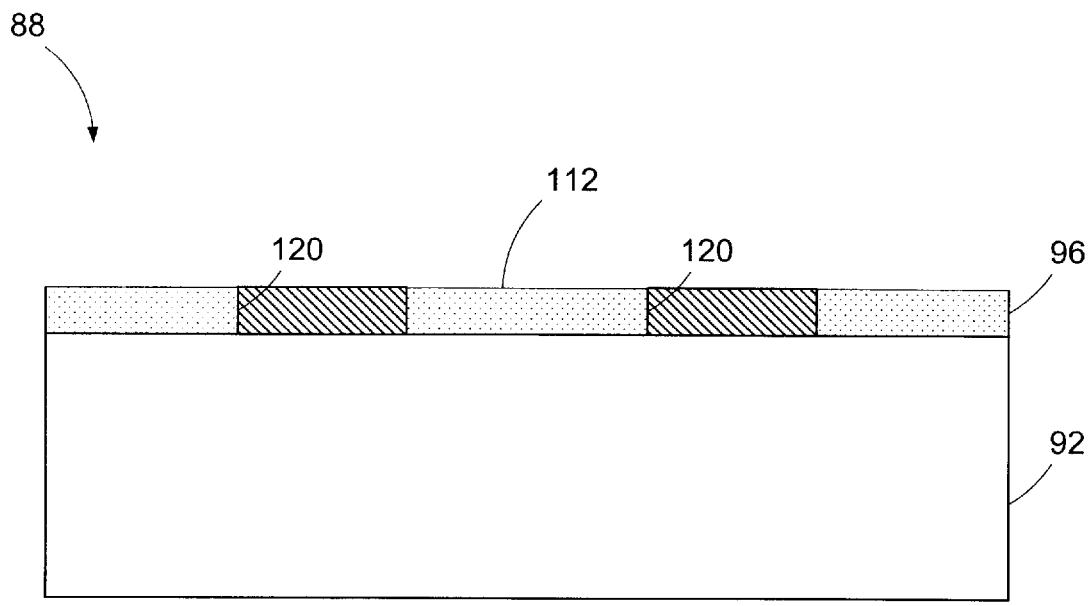
Figure 7C:
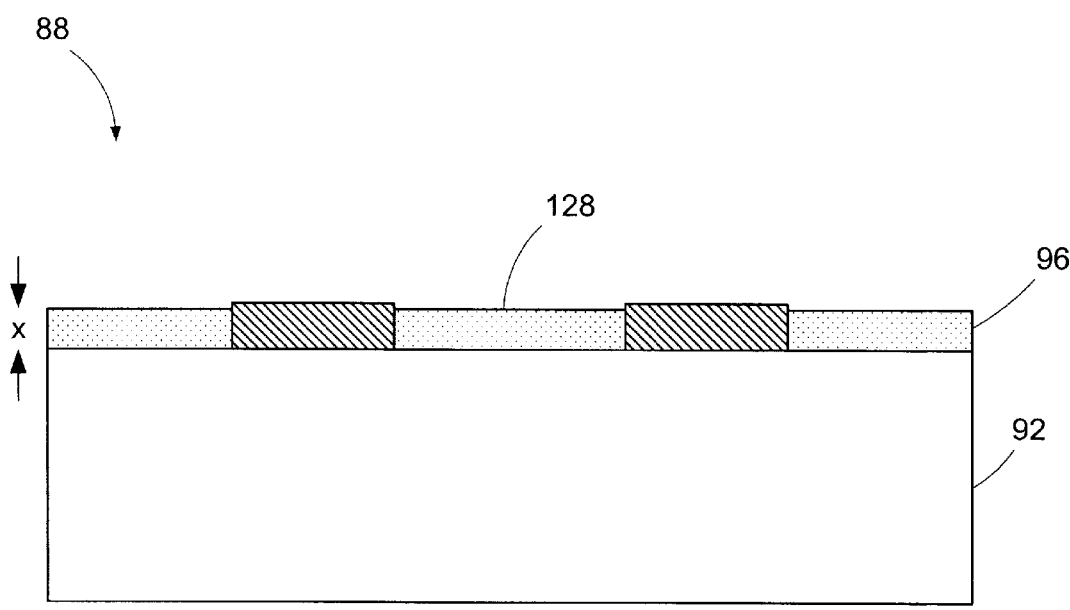

Referring to FIG. 6, an exemplary process for adjusting the duration of buff process is shown. For ease of illustration, the exemplary process will be described with reference to the exemplary control system 76, illustrated in FIG. 5. Moreover, as a method of simplification, the process will be described with reference to an exemplary cross-sectional embodiment of a wafer 84, which is illustrated in FIGS. 7A–7C.

At block 88, at least one wafer 24 having at least one process layer formed thereon may be provided. For example, referring to FIG. 7A, an exemplary cross-section of the wafer 84 is shown. It may be appreciated that FIGS. 7A–7C have been simplified to facilitate an understanding of the present invention. In FIG. 7A, the wafer 84 is comprised of a substrate 92 a first process layer 96 and a second process layer 100. Although only two process layers 96, 100 are shown, many process layers may be formed successively above a surface 104 of the wafer 88. Moreover, the process layers 96, 100 may be comprised of a variety of materials, such as metal, polysilicon, and the like.

In this illustrative embodiment, the first process layer 96 is an insulating layer comprised of silicon dioxide. Moreover, the first process layer 96 is commonly referred to as an inner layer dielectric, which may be used to electrically isolate integrated circuit components (e.g., contact pads, metal lines, and the like.) A plurality of openings 108 may be formed in the first process layer 96, and the second process layer 100, a blanket layer of tungsten, may be formed above the first process layer 96, filling the openings 108 and covering a surface 112 of the first process layer 96. Alternatively, in another embodiment, no process layers 96, 100 may be formed above the substrate 92, and the surface 104 of the wafer 84 may be accessible for processing.

Referring back to block 84 in FIG. 6, depending upon the manufacturing process, a batch of wafers 24 may be provided. For example, the batch may be comprised of twentyfive production wafers. Moreover, these wafers 24 may be part of an elaborate manufacturing process used to process semiconductor wafers 24 into finished semiconductor devices (e.g., memory chips, microprocessors, and the like.) Typically, the polishing and buffing of semiconductor wafers 24 may be required many times during the manufacturing process. For example, polishing and buffing may be used in conjunction with other semiconductor processes, such as photolithography and deposition, to produce desired circuit configurations on the processing surface 59 of a wafer 24, as illustrated in FIG. 3.

In another embodiment, monitor wafers (e.g., test wafers, not shown) may be provided. Monitor wafers may be very similar to production wafers but have some known useful processing property. For example, a desired process layer, such as silicon dioxide, may be deposited with a precise thickness on a surface of the monitor wafers. With this known characteristic, the monitor wafers may be used for determining optimum processing parameters, such as buff duration for a buff process or any other general testing of the polishing tool 36.

At block 114, the second process layer 100, formed above the wafer 88 (shown in FIG. 7A), may be at least partially removed using a polishing process. As described above, a polishing surface 116 of the second process layer 100 may be positioned against the polishing pad 44, shown in FIG. 3, and at least a portion of the second process layer 100 may be partially abraded during the polishing process.

Referring to FIG. 7B, during the polishing process, the second process layer 100 may be abraded down to approximately the surface 112 of the first process layer 96. By polishing away a portion of the second process layer 100, electrical paths (e.g., interconnects 120) may be formed in the first process layer 96. Although the duration of the polishing process may vary depending upon the application, in one embodiment, the duration of the polishing process may be approximately 45–120 seconds.

In another embodiment, a smaller portion of the second process layer 100 may be removed during the polishing process, and the underlying material (e.g., the first process layer 96) may remain substantially covered by the second process layer 100 once the polishing process is complete. For example, rather than polishing the second process layer down to the surface 112 of the first process layer 96, the second process layer 100 may be planarized by the polishing process to produce a more uniform post-polish surface. With this embodiment, only the second process layer 100 is exposed to the polishing process, and because a residual portion of the second process layer 100 remains above the first process layer 96, only the second process layer 100 is subsequently exposed to a buff process.

Referring back to FIG. 6, at block 124, at least a portion of the first process layer 96 and/or the second process layer 100 may be removed during a buffing process. As described above, the material exposed to the buff process may vary depending upon the portion of second process layer 100 removed during the polishing process. For example, in one embodiment, a residual portion of the second process layer 100 may cover the first process layer 96 after completion of the polishing process. With this example, the buff process may be used to remove surface defects or at least partially reduce the defect density of the residual portion of the second process layer 100.

Alternatively, in the illustrative example of FIGS. 7A–7C, a substantial portion of the second process layer 100 may be removed during the polishing process, and the surface 112 of the first process layer 96 may be at least partially exposed to the polishing process. Referring to FIG. 7C, a portion of the first process layer 96 may be removed during the buff process to produce a relatively defect free post-buff surface 128 of the first process layer 96 (i.e., the defect density of the first process layer 96 may be reduced by removing a portion of the first process layer 96 that may have been damaged during the polishing process.) Moreover, during the buff process, the thickness of the first process layer 96, illustrated in FIG. 7C by dimension "x", may be reduced.

Referring back to FIG. 6, at block 132, the post-buff surface 128 of the first process layer 96 may be inspected to determine, among other things, a post-buff defect density for the first process layer 96. Alternatively, if the second process layer 100 is buffed, the defect density may be determined by inspecting a post-buff surface (not shown) of the second process layer 100. Although a variety of metrology tools (not shown) may be used to determine the defect density of the first process layer, in one embodiment, an Orbot Applied Materials tool is used. For example, the metrology tool may be used to quantify the severity of any surface damages, such as microscratches, that may be present on the post-buff surface 128 of the first process layer 96, and this data may be provided to the optimizer module 80 and/or the process controller 28 of the control system 76.

In one embodiment, in conjunction with the metrology tool, auto defect classification software (ADC) may be used to quantify the defect density of the first process layer 96. For example, using process layers having known surface defects, the ADC software may be "taught" (i.e., characterized) to categorize various types of surface defects. Once "taught" to recognize these types of surface defects, using pattern recognition technology, the ADC software may be capable of recognizing similar defect patterns in process layers 96, 100 of subsequently processed wafers 84. For example, a metrology tool may "image" the wafer 84 using laser scattering, optical technology, or other know techniques, and the "imaged" wafer 84 may be assigned a predetermined defect code that represents the recognized defect pattern.

In one embodiment, once sufficiently characterized, the ADC software may be capable of assigning defect codes based on scratch count. For example, process layers having severe residual post-buff scratches may be assigned a first representative code, while process layers having less severe scratching may be assigned a second representative code. The specific defect codes may vary depending upon the desired resolution, the complexity of the metrology tool, the sophistication of the ADC software, and the like. Of course, other methods may be used to quantify the post-buff defect density of a process layer and the specific method chosen may vary as a matter of design choice.

In addition to defect density, other post-buff processing characteristics of the first process layer 96 may be measured and provided to the optimizer module 80 of the control system 76. In one embodiment, the surface non-uniformity of the first process layer 96 may be measured using a variety of know techniques. For example, with transparent processing layers (e.g., oxide, polysilicon, silicon nitride, etc.), the thickness of the first process layer 96 may be measured using ellipsometry or laser interferometry. Moreover, depending upon the particular process, the thickness of the first process layer 96 may be measured at a statistically sufficient variety of locations (e.g., at 9 radial locations across the wafer 84.) Alternatively, the first process layer 96 may be visually inspected, and post-buff process characteristics, such as scratch count, surface non-uniformity may be manually quantified and provided to the optimizer module 80. Additionally, a sacrificial wafer may be cross-sectioned at multiple locations, and the non-uniformity of the sacrificial wafer may be measured using a scanning electron microscope (SEM). Moreover, once measured, the characteristics of the sacrificial wafer may be assumed to be representative for the remaining wafers in a lot. Using similar techniques, an average post-buff thickness may be determined for the first process layer 96.

Once the desired post-buff processing data is gathered and provided to the optimizer module 80, at block 136, the duration of the buff process may be adjusted for a subsequently processed wafer (not shown) based on, among other things, the post-buff defect density (e.g., scratch count) of the first process layer 96. As described above, if the post-buff defect density of the first process layer 96 is not sufficiently reduced by the buff process, the duration of the buff process may be increased for subsequently processed wafers. Likewise, if the post-buff thickness of the first process layer 96 is too thin or the surface non-uniformity is too great, the duration of the buff process may be reduced for subsequently processed wafers. It may be appreciated that the adjustments to the duration of the buff process may vary depending upon the particular application. For example, some processes may be more sensitive to scratch count, while other processes may be more sensitive to process layer thickness, and an adjustment to the duration of the buff process may vary depending upon which processing variable is being optimized.

In one embodiment, monitor wafers may be used to determine the optimal duration of the buff process for subsequently processed production wafers (not shown.) This may occur, for instance, between processing successive lots of wafers or during periodic maintenance of the polishing tool 36. In one illustrative embodiment, the monitor wafers may be polished using the production wafer's processing recipe. Once the polishing is complete, the usual duration of the buff process may be reduced such that some surface defects may be present on the post-buff surface of the monitor wafers. Although buff time for the monitor wafers may vary depending upon the particular process, in one embodiment, the monitor wafer buff time is approximately 5–10 seconds. As described above, the post-buff surface of the monitor wafers may be inspected, and the duration of the buff process may be adjusted for the production wafers based on the residual post-buff surface defects and/or other processing variables. Again, although the production wafer buff time may vary depending upon the process, in one embodiment, the adjusted buff time is approximately 10–15 seconds. Of course, a ceiling may be set for the duration of the buff process, and in one embodiment the ceiling may be approximately 20 seconds.

In addition to optimizing the duration of the buff process, the illustrative method of FIG. 6 may be used to determine the state of the polishing tool 36. As described above, if significant duration adjustments are determined to be necessary for the buff process, the control system 76 may determine that there is a problem with the polishing tool 36 or some other tool in the manufacturing process. If this occurs, the control system 76 may shut down the polishing tool 36, and a technician may be summoned to investigate the problem. In one embodiment, if the duration of the buff process exceeds 20 seconds, the control system 76 may shut down the polishing tool 36.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a first wafer having at least one process layer formed thereon;
   removing at least a portion of a first process layer using a polishing process;
   removing at least a portion of at least one of the first process layer and a second process layer using a buffing process for a duration of time;
   inspecting a buffed surface of at least one of the first process layer and the second process layer to determine a post-buff defect density for the inspected process layer; and
   adjusting the duration of the buffing process for a second wafer based on the determined post-buff defect density of the inspected process layer.

2. The method of claim 1, wherein removing a portion of a first process layer using a polishing process comprises polishing the first process layer down to a surface of the second process layer exposing at least a portion of the surface to the polishing process.

3. The method of claim 1, wherein removing a portion of a first process layer using a polishing process comprises removing the portion of the first process layer to planarize a surface of the first process layer, a residual post-polish portion of the first process layer remaining above the second process layer.

4. The method of claim 1, wherein inspecting a buffed surface of at least one of the first process layer and the second process layer to determine a post-buff defect density comprises quantifying a scratch count of at least one of the first process layer and the second process layer.

5. The method of claim 1, further comprising:
   determining at least one post-buff processing parameter of at least one of the first process layer and the second process layer; and
   adjusting the duration of the buffing process for the second wafer based on the determined at least one post-buff processing parameter.

6. The method of claim 5, wherein determining at least one post-buff processing parameter comprises determining at least one of the group of a thickness and a surface non-uniformity for at least one of the first process layer and the second process layer.

7. The method of claim 1, wherein providing a first wafer comprises providing at least one monitor wafer to determine a duration of the buffing processing for at least one subsequently processed production wafer.

8. The method of claim 7, further comprising:

polishing the at least one monitor wafer using a polishing recipe that is substantially the same as for the subsequently processed at least one production wafer;

buffing the at least one monitor wafer using a reduced duration of the buffing process;

inspecting a post-buff surface of the at least one monitor wafer to quantify a residual defect density of the post-buff surface;

adjusting a duration of the buffing processed for the subsequently processed at least one production wafer based on the residual defect density of the post-buff surface of the at least one monitor wafer.

9. The method of claim 8, wherein the reduced duration of the buffing process for the at least one monitor wafer is approximately 10–15 seconds, and the adjusted duration of the buffing process for the at least one production wafer is approximately 15–20 seconds.

10. The method of claim 1, further comprising:

determining an operating state of a processing tool from the adjusted duration of the buffing process for the second wafer; and shutting down the processing tool if the adjusted duration of the buffing process exceeds a limit.

11. The method of claim 1, wherein the limit is approximately 20 seconds.

12. The method of claim 1, wherein adjusting a duration of the buffing process for a second wafer comprises increasing the duration of the buffing process.

13. The method of claim 1, wherein adjusting a duration of the buffing process for a second wafer comprises decreasing the duration of the buffing process.

14. A method, comprising:

providing a first wafer having a processing surface;

removing at least a portion of the processing surface using a polishing process;

removing at least a portion of the processing surface using a buffing process for a duration of time;

inspecting the buffed processing surface to determine a post-buff defect density of the processing surface; and adjusting the duration of the buffing process for a second wafer based on the determined post-buff defect density of the processing surface.

15. The method of claim 14, wherein inspecting the buffed processing surface of the first wafer to determine a post-buff defect density comprises quantifying a scratch count of the processing surface.

16. The method of claim 14, further comprising:

determining an operating state of a processing tool from the adjusted duration of the buffing process for the second wafer; and shutting down the processing tool if the adjusted duration of the buffing process exceeds a limit.

17. The method of claim 14, wherein adjusting a duration of the buffing process for a second wafer comprises increasing the duration of the buffing process.

18. The method of claim 14, wherein adjusting a duration of the buffing process for a second wafer comprises decreasing the duration of the buffing process.

19. A method, comprising:

providing a first wafer having at least one process layer formed thereon;

removing at least a portion of a first process layer using a polishing process;

removing at least a portion of at least one of the first process layer and a second process layer using a buffing process for a duration of time;

inspecting a buffed surface of at least one of the first process layer and the second process layer to determine a post-buff defect density for the inspected process layer;

adjusting the duration of the buffing process for a second wafer based on the determined post-buff defect density of the inspected process layer;

determining an operating state of a processing tool from the adjusted duration of the buffing process for the second wafer; and shutting down the processing tool if the adjusted duration of the buffing process exceeds a limit.

20. The method of claim 19, wherein the limit is approximately 20 seconds.

21. A method, comprising:

providing a wafer having a process layer formed thereon;

planarizing a surface of the process layer using a polishing process;

removing at least a portion of the planarized surface of the process layer using a buffing process for a duration of time to produce a buffed surface;

inspecting the buffed surface to determine a post-buff defect density for the process layer; and adjusting the duration of the buffing process for a second wafer based on the determined post-buff defect density of the process layer.

22. The method of claim 21, wherein inspecting a buffed surface of the process layer to determine a post-buff defect density comprises quantifying a scratch count of the process layer.

23. The method of claim 21, further comprising:

determining at least one post-buff processing parameter of the process layer; and adjusting the duration of the buffing process for the second wafer based on the determined at least one post-buff processing parameter.

24. The method of claim 21, further comprising:

determining an operating state of a processing tool from the adjusted duration of the buffing process for the second wafer; and shutting down the processing tool if the adjusted duration of the buffing process exceeds a limit.

25. The method of claim 21, wherein adjusting a duration of the buffing process for a second wafer comprises increasing the duration of the buffing process.

26. The method of claim 21, wherein adjusting a duration of the buffing process for a second wafer comprises decreasing the duration of the buffing process.

27. A system, comprising:

a processing tool adapted to remove at least a portion of a first process layer of a first wafer using a buffing process for a duration of time;

at least one metrology tool adapted to determine a post-buff defect density of at least one of the first process layer and a second process layer;

a process controller coupled to at least one of the processing tool and the at least one metrology tool, the process controller being adapted to:

receive the determined post-buff defect density from the at least one metrology tool; and adjust the duration of the buffing process for a second wafer based on the determined post-buff defect density of the first wafer.

28. The system of claim 27, wherein the at least one metrology tool is adapted to quantify a scratch count of at least one of the first process layer and the second process layer.

29. The system of claim 27, wherein the at least one metrology tool is adapted to determine at least one post-buff processing parameter of at least one of the first process layer and second process layer, and the process controller is adapted to determine a duration of the buffing process for the second wafer based on the determined at least one post-buff processing parameter.

30. The system of claim 27, wherein the process controller is adapted to:

determine an operating state of the processing tool from the adjusted duration of the buffing process for the second wafer; and shut down the processing tool if the adjusted duration of the buffing process exceeds a limit.

31. The system of claim 27, wherein the process controller is adapted to increase the duration of the buffing process.

32. The system of claim 27, wherein the process controller is adapted to decrease the duration of the buffing process.

33. A computer readable program storage device encoded with instructions that, when executed by a computer, performs a method, comprising:

providing a first wafer having at least one process layer formed thereon;

removing at least a portion of a first process layer using a polishing process;

removing at least a portion of at least one of the first process layer and a second process layer using a buffing process for a duration of time;

inspecting a buffed surface of at least one of the first process layer and the second process layer to determine a post-buff defect density for the inspected process layer; and adjusting the duration of the buffing process for a second wafer based on the determined post-buff defect density of the inspected process layer.

34. The computer readable program storage device encoded with instructions that, when executed by a computer, performs the method described in claim 33, wherein inspecting a buffed surface of at least one of the first process layer and the second process layer to determine a post-buff defect density comprises quantifying a scratch count of at least one of the first process layer and the second process layer.

35. The computer readable program storage device encoded with instructions that, when executed by a computer, performs the method described in claim 33, further comprising:

determining at least one post-buff processing parameter of at least one of the first process layer and the second process layer; and adjusting the duration of the buffing process for the second wafer based on the determined at least one post-buff processing parameter.

36. The computer readable program storage device encoded with instructions that, when executed by a computer, performs the method described in claim 33, further comprising:

determining an operating state of a processing tool from the adjusted duration of the buffing process for the second wafer; and shutting down the processing tool if the adjusted duration of the buffing process exceeds a limit.

37. The computer readable program storage device encoded with instructions that, when executed by a computer, performs the method described in claim 33, wherein adjusting a duration of the buffing process for a second wafer comprises increasing the duration of the buffing process.

38. The computer readable program storage device encoded with instructions that, when executed by a computer, performs the method described in claim 33, wherein adjusting a duration of the buffing process for a second wafer comprises decreasing the duration of the buffing process.

* * * * *